United States Patent [19]
Maruyama et al.

[11] 4,001,611
[45] Jan. 4, 1977

[54] ASYNCHRONOUS DELAY CIRCUIT

[75] Inventors: Tatsuo Maruyama, Tokyo; Hiroshi Sasaki, Kashiwa, both of Japan

[73] Assignee: Kokusai Denshin Denwa Kabushiki Kaisha, Japan

[22] Filed: Jan. 8, 1976

[21] Appl. No.: 647,584

[30] Foreign Application Priority Data

Jan. 10, 1975 Japan .................. 50-5000

[52] U.S. Cl. .................. 307/293; 307/208; 307/238; 307/215; 307/218; 307/247 R; 307/289; 307/291; 328/195; 328/206

[51] Int. Cl.² .................. H03K 5/13; H03K 19/34; H03K 3/29

[58] Field of Search .......... 307/208, 215, 218, 232, 307/247 R, 289, 291, 293; 328/109, 110, 195, 206

[56] References Cited
UNITED STATES PATENTS

| | | | |
|---|---|---|---|
| 3,444,470 | 5/1969 | Bolt et al. .................. | 307/232 |
| 3,510,787 | 5/1970 | Pound et al. .................. | 307/208 |
| 3,786,276 | 1/1974 | Rosch .................. | 307/208 |

*Primary Examiner* — Stanley D. Miller, Jr.
*Attorney, Agent, or Firm* — Robert E. Burns; Emmanuel J. Lobato; Bruce L. Adams

[57] ABSTRACT

An asynchronous delay circuit, in which a flip-flop circuit of the latch type is employed to store logical values of two transmission lines. The logical values of the two transmission lines are applied through two gates to the flip-flop circuit only when the flip-flop circuit is previously established to an empty state where logical values of the two outputs of the flip-flop circuit are coincident with each other. The flip-flop circuit may be formed by two NOR circuits or two NAND circuits. A plurality of the above mentioned asynchronous delay circuits may be successively connected in a cascade arrangement by further including differentiators, first connection lines, second connection lines, third connection lines and an input circuit to form an elastic store.

10 Claims, 6 Drawing Figures

ASYNCHRONOUS DELAY CIRCUIT

FIELD OF THE INVENTION

This invention relates to asynchronous delay circuits and their combination.

BRIEF DESCRIPTION OF THE PRIOR ART

In a logical circuit, a speed-independent asynchronous logical circuit of the type, in which detection of the completion of one logical operation is immediately followed by the starting of an immediately succeeding operation, can be used as a high-speed logical circuit utilizing the operating speed of a logical element to the fullest, since such an asynchronous logical circuit saves the access time inherent to ordinary synchronous logical circuits. Further, it has such advantages that even if its response is delayed by degradation of the logical element or the like, the likelihood of introducing an error in the result of an operation is slight, and that an erroneous operation can be easily detected. One of the fundamental components in this asynchronous logical circuit is an asynchronous delay circuit. This circuit has the function of once storing input information asynchronously supplied thereto and sending out the information from its output after a desired period of time, and accordingly it is highly useful as an asynchronous information storage circuit (a so-called elastic store) or a progess control circuit for an asynchronous logical operation.

It has been known to form the asynchronous delay circuit with a C-element which is a special storage element (i.e., an element of the type in which when two input information elements are coincident with each other, the information is newly stored, but when the two input information are not coincident, the previous information is retained) as disclosed in a publication: D. E. Muller "Asynchronous logics and application to information proceeding", Switching Theory in Space Technology, Stanford Univ. Press, 1963. However, the formation of the asynchronous delay circuit with an ordinary transistor binary logical element introduces great complexity in its circuit construction. On the other hand, the employment of an Esaki diode as the C-element for simplification of the circuit construction has also been known, but this is defective in the necessity of using such a special element as the Esaki diode. Further, an asynchronous delay circuit using a ternary logical element has been known, but this also has a disadvantage of requiring a special circuit.

BRIEF SUMMARY OF THE INVENTION

An object of this invention is to provide an asynchronous delay circuit of simple construction which is free from the above-said defects and employs only an ordinary transistor binary logical element.

Another object of this invention is to provide an elastic store of simple construction formed by a cascade arrangement of a plurality of asynchronous delay circuit.

In accordance with the present invention, there is provided an asynchronous delay circuit comprising a flip-flop circuit, two input information terminals, two gates, first control means, control terminal means and second control means. The flip-flop circuit is of the latch type having two input terminals, two output terminals and a control terminal. The two input information terminals are employed for receiving two logical inputs. The two gates are respectively connected between the two input information terminals and the two input terminals of the flip-flop circuit. The first control means comprises an AND circuit or an OR circuit, by way of example, and are connected to the output terminals of the flip-flop circuit and the two gates for applying the two logical inputs to the two input terminals of the flip-flop circuit through the two gates to store the logical inputs in the flip-flop circuit only when the flip-flop circuit is previously established to an empty state where logical values of the two outputs of the flip-flop circuit are coincident with each other. The control terminal means is provided for receiving an external control signal. The second control means comprises a control line and is connected between the control terminal means and the control terminal of the flip-flop circuit for forcing the flip-flop circuit to the empty state in response to the external control signal. The flip-flop circuit may be formed by two NOR circuits or two NAND circuits. A plurality of the above-mentioned asynchronous delay circuits may be successively connected in a cascade arrangement by further including differentiators, first connection lines, second connection lines, third connection lines and input means to form an elastic store.

BRIEF DESCRIPTION OF THE DRAWINGS

The principle, construction and operation of this invention will be clearly understood from the following detailed description taken in conjunction with the accompanying drawings.

DETAILED DESCRIPTION OF THE INVENTION

Figure 1:
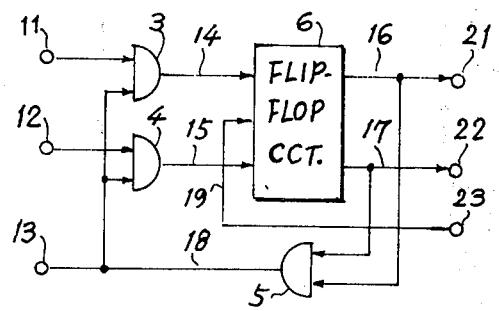
FIG. 1 is a block diagram illustrating the constructive principle of an asynchronous delay circuit of this invention.

FIG. 1 is a block diagram illustrating the constructive principle of this invention. This is a basic unit of a asynchronous delay circuit, which will hereinafter be referred to as a delay block. Reference numerals 11 and 12 respectively indicate first input information terminal and second input information terminal; 21 and 22 respectively designate first input information terminal and second output information terminal; 13 denotes an output terminal for a status indicating signal indicative of the state of the delay block; 23 identifies an input terminal for a control signal for controlling the transfer of information stored in the delay block; 3 and 4 respectively represent first gate and second gate; 5 shows an AND circuit; and 6 refers to a flip-flop circuit. Generally, the asynchronous delay circuit performs write and read operations of information independently of and asynchronously with each other unlike a synchronous delay circuit such as a shift register, so that the asynchronous delay circuit may have an information-readout state (hereinafter referred to as an empty state) in addition to an information-stored state (hereinafter referred to as a storing state). Accordingly, in a case where information is binary (a state "0" and a state "1"), the asynchronous delay circuit may have an information "0" storing state, an information "1" storing state and the empty state. For indicating these three states, the present invention employs two information lines (for example, first and second information lines 16 and 17 at the output side) as shown in FIG. 1, and the three information stages "0", "1" and "empty" are correlated to logical values on the two information lines as given in the following Table 1.

Table 1

| Information | Logical values on information lines | | Control signal output |
|---|---|---|---|
| | First line 16 | Second line 17 | |
| 0 | 0 | 1 | 0 |
| 1 | 1 | 0 | 0 |
| empty | 1 | 1 | 1 |

In the above Table 1, a combination of logical values (1, 1) is used for the information "empty"- but another combination of the logical values (0, 0) may be also employed therefore. The correlation to be employed is dependent upon the circuit construction of the flip-flop circuit 6, as will be described later on, but the following description will be given on the basis of the correlations in Table 1. Accordingly, the combination of the logical values (0, 0) is not used as the input/output information of the illustrated circuit. Since the information states and the logical values in Table 1 are completely correlated respectively, the informations "0", "1" and "empty" can be represented by the combinations of the logical values on the two information lines in the forms of (0, 1), (1, 0) and (1, 1), respectively. In order to handle such three information states, this invention uses the flip-flop circuit 6 in a special fashion. That is, a flip-flop is not usually employed such that its both outputs are the state "1" (or "0") at the same time but this invention positively utilizes such a state. The flip-flop circuit 6 is adapted to operate in such a manner that when its input lines 14 and 15 assume respectively logical values "0" and "1", its output lines 16 and 17 assume respectively logical values 0 and 1, that when the input lines 14 and 15 assume respectively logical values 1 and 0, the output lines 16 and 17 assume respectively logical values 1 and 0, and that when the input lines 14 and 15 assume the same state 1, the output lines 16 and 17 assume also the state 1. The flip-flop circuit 6 need not be a special one but is merely used in a special manner.

The operation of the delay block depicted in FIG. 1 is as follows: At first, when the delay block is in its empty state, the output lines 16 and 17 of the flip-flop circuit 6 are both the same 1, so that an output line 18 of the AND circuit 5 is the state 1. Accordingly, the gate circuits 3 and 4 are opened, through which two input information elements respectively applied to the terminals 11 and 12 are applied to the lines 14 and 15. Consequently, the delay block is established to such a state that if information is applied, it can immediately be written in the flip-flop circuit 6. In this case, when input information has not yet arrived, that is, when the combination of the logical values at the input terminals 11 and 12 is a combination of states (1, 1), the lines 14 and 15 assume the same state 1, so that the flip-flop circuit 6 remains in the "empty" state. Accordingly, the two output lines 16 and 17 assume the same state 1 and the delay block remains in the "empty" empty. However, when the information element 0 (or 1) arrives so as to apply the logical values (0, 1) (or (1, 0)) to the input terminals 11 and 12 respectively, the flip-flop circuit 6 stores the information element 0 (or 1) and its output lines 16 and 17 become the state 0 (or 1) and the state 1 (or 0), respectively. As a result of this operation, the output line 18 of the AND circuit 5 becomes the state 0 to close the input gates 3 and 4, so that the newly applied information element 0 (or 1) is stored in the flip-flop circuit 6.

The information thus stored in the flip-flop circuit 6 is retained therein until a transfer control signal is applied to a reset terminal 7 of the flip-flop circuit 6 through a terminal 23 and a line 19. Upon application of the control signal, the flip-flop circuit 6 is reset in its empty state and its output lines 16 and 17 both become the same state 1. (The "reset" herein mentioned does not imply an ordinary reset state but indicates a reset state wherein the flip-flop circuit 6 becomes the empty state having the same output state 1.) This control signal is a signal indicating that the information stored in the delay block has been read out by a certain logical circuit connected to the output terminals 21 and 22 of the delay block, that is, a signal indicative of the completion of transfer of the stored information. This control signal will be concretely described later in connection with embodiments of this invention. When the flip-flop circuit 6 has thus been reset in its empty state and, further, when the control signal has disappeared, the delay block is restored to the state described first and a new information element can be stored.

During the above operation, the output of the AND circuit 5 is applied through the line 18 to the terminal 13 and then applied as a status indicating signal to the logical circuit connected to the input terminals 11 and 12 of the delay block. This status indicating signal is a signal indicative of the state of the delay block, and it assumes the state 0 or 1 depending upon whether the delay block stores the information 0 or 1 or is in the empty state, as shown in Table 1. Accordingly, it is possible to know from the status indicating signal whether the readin operation of the information applied to the input terminals 11 and 12 has been completed or the transfer operation of the stored information has been completed, as will be described later on.

As described above, if the delay block depicted in FIG. 1 is in its empty state, this delay block immediately receives and stores input information asynchronously supplied thereto and retains the information until the stored information is read out by the logical circuit connected to the output terminals 21 and 22. Further, upon receiving the control signal indicative of the completion of transfer of the stored information, the delay block resets the stored information and returns to its empty state. Thus, the delay block completely fulfils the functions of an asynchronous delay circuit.

Figure 2A:
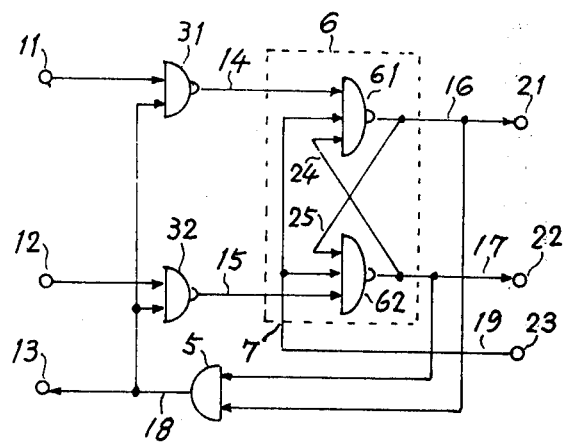
FIG. 2A is a block diagram illustrating an embodiment of this invention.

To perform the above operation, the flip-flop circuit 6 is required to have such a state that the logical values of its two outputs assume the same state 1, in addition to such states that the logical values are not coincident with each other, that is, states 0 and 1 or states 1 and 0. To this end, a well-known latch-type flip-flop circuit can be employed. FIG. 2A illustrates one concrete embodiment of this invention employing a latch-type flip-flop circuit. Reference numerals 61 and 62 indicate three-input NAND circuits constituting the flip-flop circuit 6, and 31 and 32 designate NAND circuits respectively corresponding to the input gates in FIG. 1. In case of forming the flip-flop circuit 6 with NAND circuits as in this example, if at least one input line of each of the NAND circuits 61 and 62 become the state 0 (for example, input lines 14 and 15), both outputs of the NAND circuits 61 and 62 become the same state 1, so that, by correlating this state with the information "empty", the relationships shown in Table 1 can be realized.

It is now assumed that no control signal is being applied to the terminal 23 and that the line 19 assume therefore the state 1. When the delay block is in its empty state, the both outputs (the lines 16 and 17) of the flip-flop circuit 6 assume the same state 1, so that the output line 18 of the AND circuit 5 assume the state 1 to hold the NAND circuits 31 and 32 with their opened states. At this time, if the input information is "empty" and consequently the terminals 11 and 12 assume both the same state 1, the outputs of the NAND circuits 31 and 32 assume both the same 0 and they are applied through the lines 14 and 15 to the NAND circuits 61 and 62, with the result that their outputs (the lines 16 and 17) assume both the same 1 and the delay block remains in the empty state. However, upon arrival of the information 0, the terminal 11 becomes a state 0 where (the terminal 12 remains in the state 1) and consequently the output of the NAND circuit 31 becomes the state 1, so that all three inputs to the NAND circuit 61 become the same state 1 and its output is reversed to the state 0. However, since the input line 15 of the NAND circuit 62 assumes the state 0, its output remains the state 1. As a result of this operation, the output of the AND circuit 5 becomes the state 0 and consequently the outputs of the NAND circuits 31 and 32 both become the same state 1. Accordingly, the output of the NAND circuit 61 is held in the state 0 and the output of the NAND circuit 62 is held in the state 1 in response to the state 0 of the line 25. In this manner, the information 0 is stored in the flip-flop circuit 6 and the lines 16 and 17 become the states 0 and 1, respectively. It can be readily seen that also in case of arrival of the information 1, the delay block similarly operates to store the information 1 and that the output lines 16 and 17 become the states 1 and 0, respectively. Next, when the delay block has thus stored the information, if a control signal of the logical value 0 is applied to the terminal 23, the line 19 becomes the state 0, so that the outputs of the NAND circuits 61 and 62 both become the same state 1, thereby the flip-flop circuit 6 being reset to its empty state. While this control signal exists, the flip-flop circuit 6 is retained in this reset state regardless of the logical values of the lines 14 and 15. However, at the same time as this control signal disappears, the flip-flop circuit 6 is restored to the state described first to be ready for reception of new information.

Figure 2B:
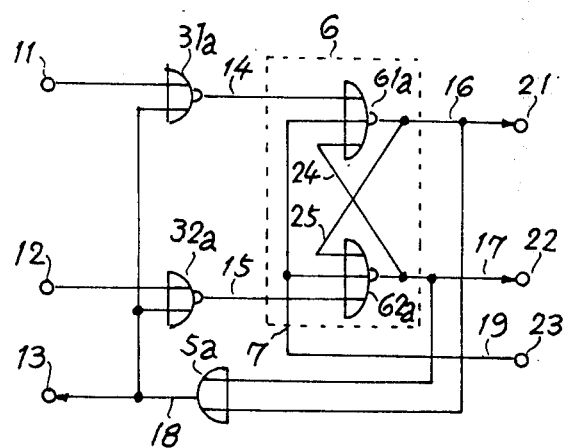
FIG. 2B is a modification of the embodiment shown in FIG. 2A.
Figure 3A:
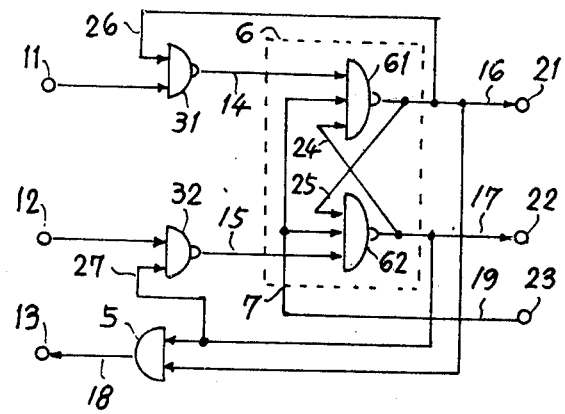
FIG. 3A is block diagram illustrating another embodiment of this invention.

Next, another concrete embodiment of this invention is shown in FIG. 3A. This embodiment is different from the embodiment shown in FIG. 2A only in that the output of the NAND circuits 61 and 62 on lines 26 and 27 are respectively used as control signals for opening and closing the input gates 31 and 32. As is evident from the description of the circuit shown in FIG. 2A, the functions of the gates 31 and 32 are such that when the information 0 or 1 is written in the flip-flop circuit 6, they are closed to retain (store) the information in the flip-flop circuit 6. Now, the following will describe that this function can be fulfilled by the embodiment shown in FIG. 3A, too. For example, in a state where the information 0 is written in the flip-flop circuit 6, since the outputs of the NAND circuits 61 and 62 become the states 0 and 1, respectively, the line 26 becomes the state 0 to close the gate 31. But, since the line 27 assumes the state 1, the gate 32 remains open unlike in the embodiment shown in FIG. 2, so that the line 15 changes in response to the information applied to the terminal 12. However, since the input line 25 of the NAND circuit 62 is the state 0, it is known that its output is held at the state 1 regardless of the value of the input line 15 and that the outputs of the NAND circuits 61 and 62 are remained the states 0 and 1, that is, the written information 0 is stored, as it is, in the flip-flop circuit 6. In other words, when the information 0 is stored, it does not matter if the gate 32 remains open. The above is a case where the information 0 is written, and it is apparent from the symmetricity of the circuit that the same is true of the case of the information 1. From the above, it appears that the circuit shown in FIG. 3A also fulfils the functions of the asynchronous circuit.

Figure 4:
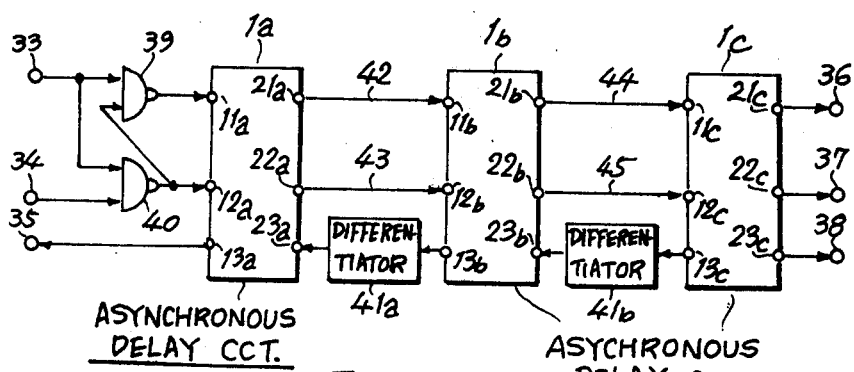
FIG. 4 is a block diagram illustrating asynchronous delay circuits of this invention applied to form an elastic store.

The foregoing description has been given with regard to the construction and the operation of one delay block of the asynchronous delay circuit and clarified that the delay block itself fulfils all of the functions of the asynchronous delay circuit. This delay block is of wide application. Now, a description will be given of, for example, an asynchronous information storage circuit, that is, a so-called elastic store, which is produced by successively connecting a plurality of delay blocks in cascade. FIG. 4 illustrates its one example, in which reference numeral 33 indicates a write pulse input terminal; 34 designates an input information terminal; 35 identifies a status indicating signal output terminal; 36 and 37 denote first and second output information terminals; 38 represents a read pulse input terminal; 39 and 40 show NAND circuits; and 41a and 41b refer to differentiation circuits. Reference numerals 1a, 1b and 1c indicate the delay blocks described in the foregoing and their terminals 11a, 12a, . . . correspond to the terminals 11, 12, . . . in FIG. 1. In case of the elastic store, some constructions can be considered in accordance with the manner of producing the control signal indicative of the completion of transfer of information. The present embodiment employs a signal which is produced by the differentiation of the point of transition from the state 0 to the state 1 of the status indicating signal output of the subsequent delay block. The above point of transition corresponds to an instant at which an immediately subsequent delay block changes from its empty state to the stored state, that is, an instant at which information is read in the instant delay block from an immediately preceding stage. The differentiation circuits 41a and 41b are provided for this purpose and each generate a pulse which becomes the state 0 for a very short period of time at the transition point from the state 0 to the state 1.

This circuit performs the following operations. In the absence of input information, the input pulse assumes the state 0, so that the terminal 33 assumes the state 0 and consequently the outputs of the NAND circuits 39 and 40 are both 1. When the input information 0 (or 1) is applied to the terminal 34 and, at the same time, the input pulse also becomes the state 1, the outputs of the NAND circuits 39 and 40 become the state 0 (or 1) and the state 1 (or 0), respectively. In this manner, the information 0, 1 and "empty" of the input are converted into the combinations of the logical values on the two information lines shown on Table 1. When the converted pair of information states are applied to the input terminals 11a and 12a of the first delay block 1a, the delay block 1a operates in the manner described previously to store therein the input information. Next, the stored result is applied through the lines 42 and 43 to the second delay block 1b, so that if the delay block 1b is in its empty state, the information is immediately stored therein. As a result of this, the status indicating signal at the terminal 13b changes from a state 0 (the empty state) to a state 1 (the storing state) and it is differentiated by the differentiation circuit 41a, providing at the terminal 23a a differentiated pulse which becomes the state 0 for a very short period of time. Accordingly, the delay block 1a is reset by the differentiated pulse to the empty state from the stored state. Thus, the input information applied to the terminal 34 is temporarily stored in the delay block 1a and then transferred to the delay block 1b. In a similar manner, if the delay block 1c is in its empty state, the information is immediately transferred to the delay block 1c. On the other hand, when the delay block 1c is still in its stored state, the newly input information is retained in the delay block 1b until the contents stored in the delay block 1c has been read out to restore the delay block to its empty state. Thus, information elements are consecutively stored without insertion of any empty stage in the elastic store from the last stage.

Next, when the contents stored in the delay block 1c are read out to an external circuit under such conditions, a read pulse of a polarity 0 is applied to the terminal 38 at the same time, by which the delay block 1c is reset to its empty state. At this time, if a new information element has already been stored in the preceding delay block 1b, the stored information is transferred to the delay block 1c to be consecutively stored therein from the last stage thereof. From the above description, it is evident that the circuit depicted in FIG. 4 sufficiently performs the functions of the elastic store.

Figure 3B:
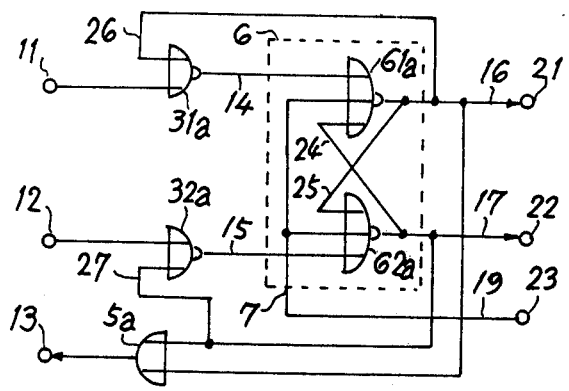
FIG. 3B is a modification of the embodiment shown in FIG. 3A.

While the above embodiments have been described with regard to the case of employing AND and NAND circuits as logical elements, it is also possible to use OR and NOR circuits as shown in FIGS. 2B and 3B. In this case, however, since such a state that the outputs of two NOR circuits making up the flip-flop circuit assume the same state 1 is unstable and impracticable, it is impossible to adopt such a combination of states 1 and 1 to the information "empty" as shown in Table 1. But, such a stable state that the two outputs assume the same state 0 can be obtained by making the input lines of the two NOR circuits the same state 1, so that the combination of the logical values 0 and 0 can be correlated to the information "empty". It is sufficient to replace the NAND circuits 31, 32, 61 and 62 and the AND circuit 5 in FIGS. 2A and 3B by NOR circuits 31a, 32a, 61a and 62a and an OR circuit 5a. The description previously given with regard to the circuits of FIGS. 2A and 3A may be applied to the operation in this case, if the logical value 0 is replaced by the state 1 in the description.

Further, the status indicating signal at the terminal 13 mentioned in the foregoing embodiments is unnecessary for the type of the logical circuit connected to the stage preceding the delay block and is not always indispensable to the asynchronous delay circuit.

For the asynchronous transfer of information as in the asynchronous delay line, it is necessary to handle three information states 0, 1 and "empty". In order to indicate them, the principle employing two information lines is usually adopted but, in conventional asynchronous delay circuits, use has been made of such a principle that two memory elements are provided in correspondence to the two information lines. On the other hand, in the present invention, an asynchronous delay circuit employing only one memory element (a flip-flop) for two information lines is realized by utilizing such a condition that the two outputs of the flip-flop assume the same state 1 (or 0). As a result of this, an asynchronous delay circuit of very simple construction, where the number of its elements is about ½ that in the prior art, could have been realized by the use of an ordinary transistor binary logical circuit. As referred to above in connection with the embodiments, this asynchronous delay circuit is of very wide application as a basic block of the elastic store and as a control element of an asynchronous logical circuit whose advantages have recently been evaluated again with a demand for speeding up of logical operation. Accordingly, the effect of simplification of the asynchronous delay circuit by the present invention is great.

What we claim is:
1. An asynchronous delay circuit comprising:
a flip-flop circuit having two input terminals, two output terminals and a control terminal;
two input information terminals for receiving two logical inputs;
two gates respectively connected between said two input information terminals and the two input terminals of said flip-flop circuit;
first control means connected to the output terminals of said flip-flop circuit and said two gates for applying the two logical inputs to the two input terminals of the flip-flop circuit through said two gates to store the logical inputs in the flip-flop circuit only when the flip-flop circuit is previously established to an empty state where logical values of the two outputs of said flip-flop circuit are coincident with each other;
control terminal means for receiving an external control signal; and
second control means connected between said control terminal means and said control terminal of said flip-flop circuit for forcing said flip-flop circuit to said empty state in response to said external control signal.

2. An asynchronous delay circuit according to claim 1, in which said flip-flop circuit is of a latch-type.

3. An asynchronous delay circuit according to claim 2, in which said flip-flop circuit comprises two NAND circuits each having first, second and third inputs and an output, respective first inputs of the two NAND circuits being connected to respective outputs of said two gates, respective second inputs of the two NAND circuits being connected together to said control terminal means, said third input of one of the two NAND circuits being connected to said output of the remaining one of the two NAND circuits.

4. An asynchronous delay circuit according to claim 3, in which said first control means comprises and AND circuit having two inputs respectively connected to the outputs of said two NAND circuits, the output of said AND circuit being connected to respective one control terminals of said two gates.

5. An asynchronous delay circuit according to claim 3, in which said first control means comprises first and second connection lines, said first connection line being connected between the output of one of the two NAND circuits and the control terminal of one of said two gates to which said first input and said one of the two NAND circuits is connected, said second connection line being connected between the output of the other of the two NAND circuits and the control terminal of the other of said two gates to which said first input of the other of the two NAND circuits is connected.

6. An asynchronous delay circuit according to claim 2, in which said flip-flop circuit comprises two NOR circuits each having first, second and third inputs and an output, respective first inputs of the two NOR circuits being connected to respective outputs of said two gates, respective second inputs of the two NOR circuits being connected together to said control terminal means, said third input of one of the two NOR circuits being connected to said output of the remaining one of the two NOR circuits.

7. An asynchronous delay circuit according to claim 6, in which said first control means comprises an OR circuit having two inputs respectively connected to the outputs of said two NOR circuits, the output of said OR circuit being connected to respective one control terminals of said two gates.

8. An asynchronous delay circuit according to claim 6, in which said first control means comprises first and second connection lines, said first connection line being connected between the output of one of the two NOR circuits and the control terminal of one of said two gates to which said first input of said one of the two NOR circuits is connected, said second connection line being connected between the output of the other of the two NOR circuits and the control terminal of the other of said two gates to which said first input of the other of the two NOR circuits is connected.

9. In combination, input means, differentiators, first connection lines, second connection lines, third connection lines and a plurality of asynchronous delay circuits connected in an cascade arrangement through said first connection lines, said second connection lines and said third connection lines each including one of said differentiators.

each of said asynchronous delay circuits comprising:

a flip-flop circuit of latch type having two input terminals, two output terminals and a control terminal;

two input information terminals for receiving two logical inputs;

two gates respectively connected between said two input information terminals and the two input terminals of said flip-flop circuit;

first control means connected to the output terminals of said flip-flop circuit and said two gates for applying the two logical inputs to the two input terminals of the flip-flop circuit through said two gates to store the logical inputs in the flip-flop circuit only when the flip-flop circuit is previously established to an empty state where logical values of the two outputs of said flip-flop circuit are coincident with each other;

control terminal means for receiving an external control signal; and second control means connected between said control terminal means and said control terminal of said flip-flop circuit for forcing said flip-flop circuit to said empty state in response to said external control signal;

each of said first connection lines and each of said second connection lines being respectively connected between said two outputs of the flip-flop circuit of an instant state of said asynchronous delay circuits and said two inputs of the flip-flop circuit of an immediately succeeding stage of said asynchronous delay circuits, each of said third connection lines being connected through said one of said differentiators between the output of said first control means of the flip-flop circuit of an instant stage of said asynchronous delay circuit and said control terminal means of the flip-flop circuit of an immediately preceding stage of said asynchronous delay circuits, said two input terminals of a most-preceding stage of said asynchronous delay circuit being connected to said input means for receiving a logical input.

10. A combination according to claim 9, in which said input means comprises two input NAND circuits each having two inputs, one of which is connected to a terminal for receiving a write pulse, the other of two inputs of one of said two input NAND circuits being connected to a terminal for receiving said logical input, the other of two inputs of the other of said two input NAND circuits being connected to the output of said one of said two input NAND circuits.

* * * * *